United States Patent
Kwon et al.

(10) Patent No.: US 10,797,251 B2
(45) Date of Patent: Oct. 6, 2020

(54) FLEXIBLE DISPLAY APPARATUS AND TOUCH SENSITIVE DISPLAY APPARATUS

(71) Applicant: SAMSUNG DISPLAY CO., LTD., Yongin-si, Gyeonggi-do (KR)

(72) Inventors: Dohyun Kwon, Yongin-si (KR); Minjung Lee, Yongin-si (KR); Jaeneung Kim, Yongin-si (KR); Mi Jang, Yongin-si (KR); Haseok Jeon, Yongin-si (KR); Changyong Jung, Yongin-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 16/216,013

(22) Filed: Dec. 11, 2018

(65) Prior Publication Data
US 2019/0245156 A1   Aug. 8, 2019

(30) Foreign Application Priority Data
Feb. 2, 2018   (KR) .................. 10-2018-0013437

(51) Int. Cl.
*G06F 1/16*   (2006.01)
*H01L 51/00*   (2006.01)
(Continued)

(52) U.S. Cl.
CPC ........ *H01L 51/0097* (2013.01); *G06F 1/1652* (2013.01); *G06F 3/044* (2013.01);
(Continued)

(58) Field of Classification Search
CPC ........ G06F 1/1652; G06F 2203/04102; G09G 2380/02; G09F 9/301; H01L 2251/5338; H04M 1/0268
See application file for complete search history.

(56) References Cited

U.S. PATENT DOCUMENTS

| | | | |
|---|---|---|---|
| 9,287,342 B2 | 3/2016 | Kwon et al. | |
| 2014/0306941 A1* | 10/2014 | Kim | G06F 1/1652 345/204 |
| 2015/0036299 A1* | 2/2015 | Namkung | G02F 1/133345 361/749 |
| 2016/0308139 A1* | 10/2016 | Seo | H01L 51/0067 |
| 2017/0062760 A1 | 3/2017 | Kim | |

(Continued)

FOREIGN PATENT DOCUMENTS

| | | | |
|---|---|---|---|
| CN | 106920829 | 7/2017 | |
| CN | 108242462 A * | 7/2018 | ........ G06K 9/0004 |

(Continued)

OTHER PUBLICATIONS

The extended European search report for the corresponding European Application No. 19154370.1 dated Jun. 24, 2019.

*Primary Examiner* — Gene W Lee
(74) *Attorney, Agent, or Firm* — Kile Park Reed & Houtteman PLLC (57) ABSTRACT

A flexible display apparatus includes a flexible substrate including a display area and a bending area outside the display area, the bending area to be bent around a bending axis; an inorganic insulating layer on the flexible substrate; a cut unit in the inorganic insulating layer in the bending area; a stress relaxation layer filling the cut unit and extending into the display area; a wiring part on the stress relaxation layer in the bending area; a planarization layer covering the wiring part and on the stress relaxation layer; and a display on the planarization layer in the display area and electrically connected to the wiring part.

19 Claims, 9 Drawing Sheets

(51) Int. Cl.
  *H01L 27/32* (2006.01)
  *G09F 9/30* (2006.01)
  *H04M 1/02* (2006.01)
  *G06F 3/041* (2006.01)
  *G06F 3/044* (2006.01)
  *H01L 51/50* (2006.01)
  *H01L 51/52* (2006.01)

(52) U.S. Cl.
  CPC ............ *G06F 3/0412* (2013.01); *G09F 9/301* (2013.01); *H01L 27/323* (2013.01); *H01L 27/3258* (2013.01); *H01L 27/3262* (2013.01); *H01L 27/3265* (2013.01); *H01L 27/3276* (2013.01); *H01L 51/5012* (2013.01); *H01L 51/5218* (2013.01); *H01L 51/5234* (2013.01); *H01L 51/5256* (2013.01); *H01L 51/5284* (2013.01); *H04M 1/0268* (2013.01); *G06F 2203/04102* (2013.01); *G09G 2380/02* (2013.01); *H01L 2251/5338* (2013.01)

(56) References Cited

U.S. PATENT DOCUMENTS

| 2017/0153749 | A1* | 6/2017 | Noguchi | G06F 3/044 |
| 2017/0277288 | A1 | 9/2017 | Choi et al. | |
| 2017/0278901 | A1* | 9/2017 | Kim | H01L 51/0097 |
| 2017/0288005 | A1 | 10/2017 | Kawata | |
| 2017/0309846 | A1 | 10/2017 | Kim et al. | |
| 2018/0145125 | A1* | 5/2018 | Lee | H01L 27/3262 |
| 2018/0366586 | A1* | 12/2018 | Son | H01L 27/3276 |
| 2019/0164487 | A1* | 5/2019 | Lee | H01L 27/0248 |
| 2019/0220644 | A1* | 7/2019 | Sun | H01L 27/3276 |

FOREIGN PATENT DOCUMENTS

| EP | 3 223 122 | 9/2017 |
| EP | 3 223 324 | 9/2017 |
| EP | 3 327 809 | 5/2018 |
| EP | 3 333 896 | 6/2018 |
| KR | 10-2015-0019129 A | 2/2015 |
| KR | 10-2015-0074808 A | 7/2015 |
| KR | 10-2017-0024200 A | 3/2017 |

\* cited by examiner

FLEXIBLE DISPLAY APPARATUS AND TOUCH SENSITIVE DISPLAY APPARATUS

CROSS-REFERENCE TO RELATED APPLICATION

Korean Patent Application No. 10-2018-0013437, filed on Feb. 2, 2018, in the Korean Intellectual Property Office, and entitled: "Flexible Display Apparatus and Touch Sensitive Display Apparatus," is incorporated by reference herein in its entirety.

BACKGROUND

1. Field

One or more embodiments relate to a flexible display apparatus, and more particularly, to a flexible display apparatus having a bending area.

2. Description of the Related Art

Organic light-emitting display apparatuses have a self-emission characteristic, thus no separate light source is needed, allowing a thickness and a weight thereof to be reduced. In addition, the organic light-emitting display apparatuses have high-grade characteristics such as low power consumption, high brightness, and a quick response speed.

An organic light-emitting display apparatus includes a substrate, a thin-film transistor on the substrate, an organic light-emitting device of which emission is controlled by the thin-film transistor, and a plurality of insulation layers arranged among electrodes forming the thin-film transistor. Recently, organic light-emitting display apparatuses including a flexible substrate and having a bending area have been developed.

SUMMARY

According to one or more embodiments, a flexible display apparatus includes: a flexible substrate including a display area and a bending area outside the display area, the bending area to be bent around a bending axis; an inorganic insulating layer on the flexible substrate; a cut unit in the inorganic insulating layer in the bending area; a stress relaxation layer filling the cut unit and extending into the display area; a wiring part on the stress relaxation layer in the bending area; a planarization layer covering the wiring part and on the stress relaxation layer; and a display on the planarization layer in the display area and electrically connected to the wiring part.

The inorganic insulating layer may include a plurality of inorganic films.

In the display area, the planarization layer may be on the stress relaxation layer.

The cut unit may extend in a direction parallel to the bending axis.

The stress relaxation layer may include an organic insulating material.

A thickness of the stress relaxation layer in the cut unit may be greater than a depth of the cut unit.

A lower surface of the stress relaxation layer in the cut unit may come in direct contact with an upper surface of the flexible substrate.

The flexible display apparatus may further include a thin-film transistor electrically connecting the display to the wiring part and in the display area, wherein a distance from an upper surface of the planarization layer to the flexible substrate in a region overlapping the thin-film transistor may be substantially the same as a distance from the upper surface of the planarization layer to the flexible substrate in a region overlapping the cut unit.

The planarization layer may include an organic insulating material.

The flexible display apparatus may further include a thin-film transistor electrically connecting the display to the wiring part and in the display area, wherein an upper surface of the uppermost electrode of the thin-film transistor is higher than an upper surface of the stress relaxation layer.

The wiring part may include the same material as the uppermost electrode of the thin-film transistor.

The flexible display apparatus may further include, in the display area, a thin-film transistor electrically connecting the display to the wiring part, wherein an upper surface of the uppermost electrode of the thin-film transistor is lower than or equal to an upper surface of the stress relaxation layer.

The wiring part may include the same material as the uppermost electrode of the thin-film transistor.

The stress relaxation layer may have an opening and the uppermost electrode of the thin-film transistor may be in the opening.

The flexible substrate may include: a first substrate including a polymer resin; a second substrate on the first substrate and including a polymer resin; and a barrier film between the first substrate and the second substrate.

In the cut unit, the lower surface of the stress relaxation layer may come in direct contact with an upper surface of the second substrate.

The flexible display apparatus may further include an encapsulation part covering the display and including at least one inorganic film and at least one organic film.

According to one or more embodiments, a touch-detecting display apparatus includes: a flexible substrate including a display area and a bending area outside the display area, the bending area to be bent around a bending axis; an inorganic insulating layer on the flexible substrate; a stress relaxation layer filling a cut unit in the inorganic insulating layer in the bending area, and extending into the display area; a wiring part on the stress relaxation layer in the bending area; a planarization layer covering the wiring part and on the stress relaxation layer; a display on the planarization layer in the display area and electrically connected to the wiring part; a flexible encapsulation part covering the display; a touch detection layer on the flexible encapsulation part; color filters on the touch detection layer; and a black matrix between the color filters.

The display may include a first electrode, an organic light-emitting layer, and a second electrode, and a tilt angle of the first electrode with a plane parallel to the flexible substrate may be smaller than 0.1°.

The color filters and the black matrix may share an overlapping area.

In the display area, the planarization layer may be on the stress relaxation layer.

A pad electrode electrically connected to the wiring part may be at an edge of the flexible substrate, and when the bending area is folded, the pad electrode may overlap the display area.

In the cut unit, a thickness of the stress relaxation layer may be greater than a depth of the cut unit.

The touch-detecting display apparatus further include, in the display area, a thin-film transistor electrically connecting the display to the wiring part, wherein a distance from an upper surface of the planarization layer to the flexible substrate in a region overlapping the thin-film transistor may be substantially the same as a distance from the upper surface of the planarization layer to the flexible substrate in a region overlapping the cut unit.

Other aspects, features, and advantages other than those described above will be clear from the detailed description, the claims, and the drawings below to carry out the present disclosure.

BRIEF DESCRIPTION OF THE DRAWINGS

Features will become apparent to those of skill in the art by describing in detail exemplary embodiments with reference to the attached drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

When it is described through the embodiments that a certain element, such as a layer, a film, a region, or a substrate, is located "on" another element, it may be understood that the certain element may be located "on" another element directly or via another element in the middle. In addition, for convenience of description, in the accompanying drawings, sizes of components may be exaggerated or reduced. For example, the size and the thickness of each component shown in the drawings are arbitrarily shown for convenience of description, and thus the present disclosure is not necessarily limited thereto.

In the embodiments, an x axis, a y axis, and a z axis are not limited to three axes of a rectangular coordinate system but may be analyzed as a wide meaning including the same. For example, the x axis, the y axis, and the z axis may be orthogonal to each other or may indicate different directions that are not orthogonal to each other.

Figure 1:
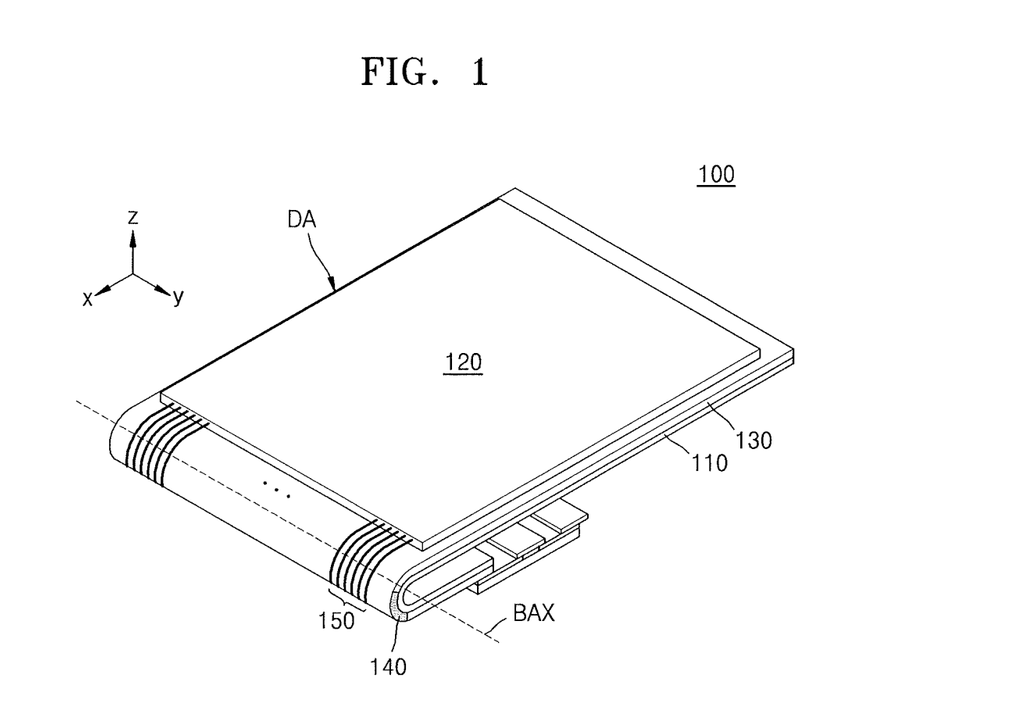
FIG. 1 illustrates a schematic perspective view of a flexible display apparatus according to a first embodiment.
Figure 2:
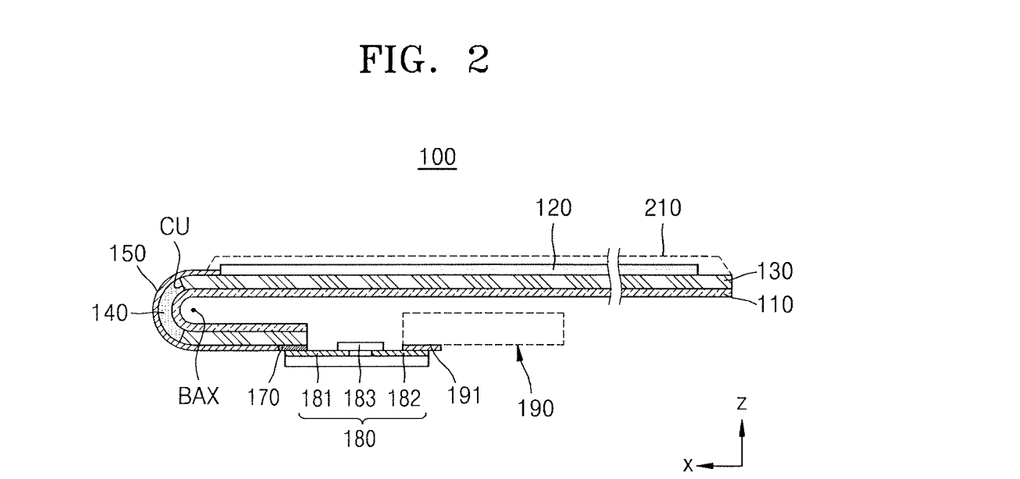
FIG. 2 illustrates a schematic cross-sectional view of the flexible display apparatus shown in FIG. 1.
Figure 3:
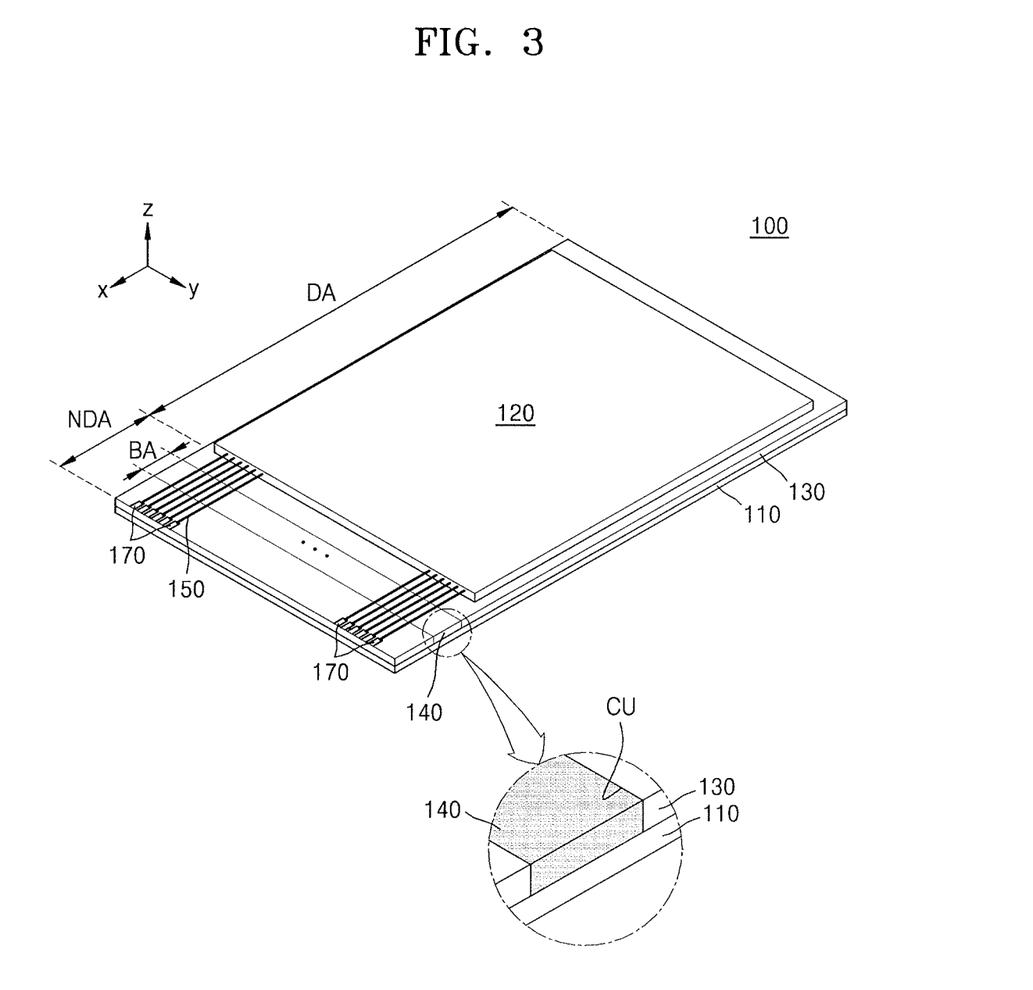
FIG. 3 illustrates a schematic perspective view showing an unfolded state of the flexible display apparatus shown in FIG. 1.
Figure 4:
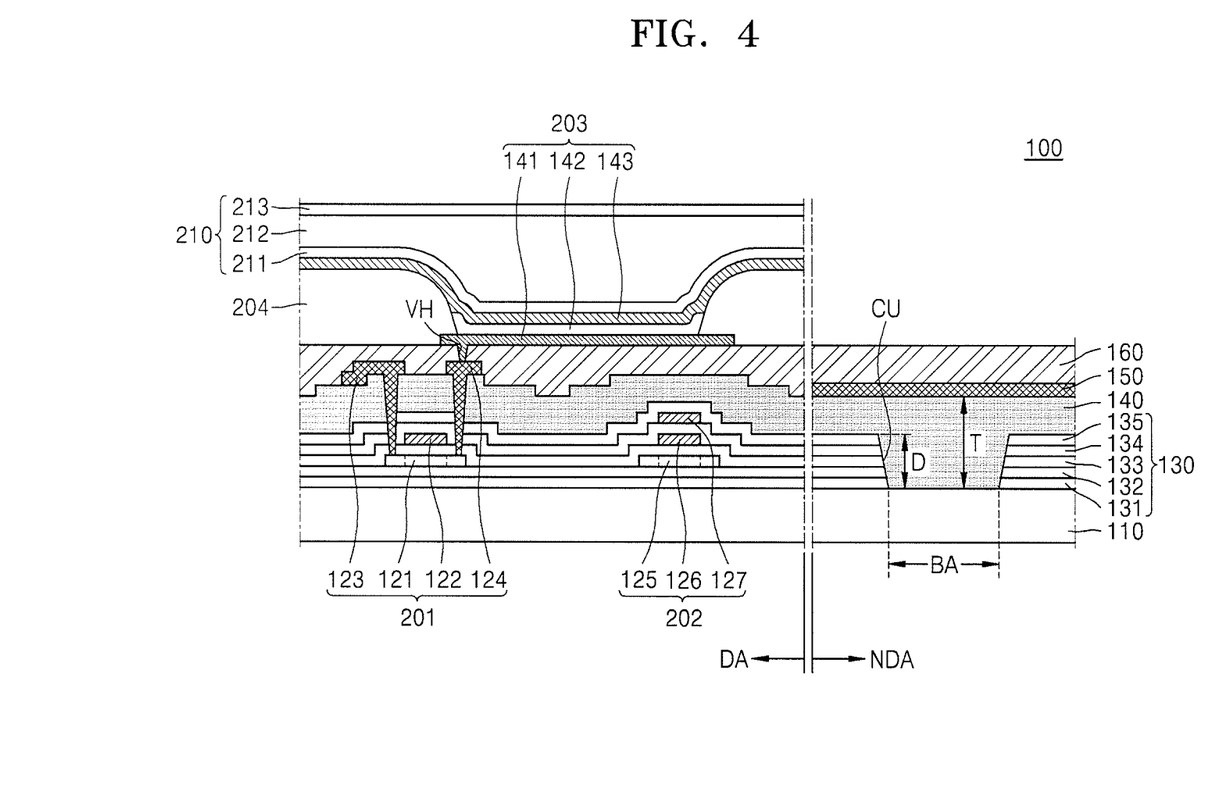
FIG. 4 illustrates a schematic cross-sectional view showing a display area DA and a bending area BA of the flexible display apparatus shown in FIG. 1.

FIG. 1 is a schematic perspective view of a flexible display apparatus 100 according to a first embodiment. FIG. 2 is a schematic cross-sectional view of the flexible display apparatus 100 shown in FIG. 1. FIG. 3 is a schematic perspective view showing an unfolded state of the flexible display apparatus 100 shown in FIG. 1. FIG. 4 is a schematic cross-sectional view showing a display area DA and a bending area BA of the flexible display apparatus 100 shown in FIG. 1.

Referring to FIGS. 1 to 4, the flexible display apparatus 100 according to an embodiment may include a flexible substrate 110, a display 120 formed on the flexible substrate 110, an inorganic insulating layer 130, a stress relaxation layer 140, a wiring part 150, a planarization layer 160, and an encapsulation part 210. In addition, the flexible display apparatus 100 may further include a pad electrode 170, a chip on film (COF) 180, and a printed circuit board (PCB) 190.

In the present embodiment, the flexible substrate 110 includes the display area DA in which the display 120 is formed, and includes the bending area BA extending in a first direction (+y direction) in a non-display area NDA outside the display area DA and bent around a bending axis BAX.

The flexible substrate 110 may include various materials having a flexible or bendable characteristic, e.g., a polymer resin such as polyethersulphone, polyacrylate, polyetherimide, polyethylene naphthalate, polyethyleneterephthalate, polyphenylene sulfide, polyarylate, polyimide, polycarbonate, cellulose acetate propionate, and the like. The flexible substrate 110 may also be variously modified such that the flexible substrate 110 may have a multi-layer structure including two layers including such a polymer resin and a barrier layer between the two layers, e.g., an inorganic material such as silicon oxide, silicon nitride, or silicon oxynitride.

The display 120 includes a plurality of pixels and displays an image by combining light emitted from the plurality of pixels. Each pixel may include a pixel circuit and an organic light-emitting device. The pixel circuit may include at least two thin-film transistors and at least one capacitor to control light emission of the organic light-emitting device. A detailed structure of the display 120 will be described later.

The bending area BA may be a portion of the non-display area NDA. A plurality of pad electrodes 170 may be formed at an edge of the flexible substrate 110 extending from the bending area BA in a second direction (+x direction). The wiring part 150 including signal lines such as scan lines and data lines electrically connected to the plurality of pixels and power lines such as driving voltage lines are electrically connected to the pad electrodes 170.

The pad electrodes 170 may be connected to the COF 180. The COF 180 may be replaced by a flexible printed circuit (FPC). The COF 180 may be connected to the PCB 190.

The COF 180 may include an output wiring part 181, a driving chip 183, and an input wiring part 182. The PCB 190 is connected to the input wiring part 182 of the COF 180 and inputs, to the COF 180, a control signal for controlling the driving chip 183 of the COF 180. The output wiring part 181 of the COF 180 is connected to the pad electrodes 170 and outputs, to the pad electrodes 170, power and various kinds of signals for controlling display of the flexible display apparatus 100.

When the non-display area NDA including the wiring part 150 and the pad electrodes 170 is located alongside the display area DA without being bent (see FIG. 3), an area of a dead space outside the display 120 increases. The flexible display apparatus 100 according to the present embodiment has the bending area BA formed by bending a portion of the non-display area NDA in which the wiring part 150 extends. As a bending result, the edge of the flexible substrate 110, on which the pad electrodes 170 are formed, overlaps the display area DA at the rear of the display area DA. Thus the dead space outside the display 120 is minimized.

The bending area BA is bent around the bending axis BAX. The center of curvature of the bending area BA is located on the bending axis BAX. Referring to FIGS. 1 and 2, the bending axis BAX is parallel to the y axis.

The inorganic insulating layer 130 including at least one inorganic film among a barrier film 131, a buffer film 132, a gate insulating film 133, a first interlayer insulating film 134, and a second interlayer insulating film 135 on the flexible substrate 110. The inorganic insulating layer 130 may be between electrodes and wirings included in the display 120 to insulate the same.

In the present embodiment, the inorganic insulating layer 130 in the bending area BA may have a cut unit CU that extends in a direction (y-axis direction) parallel to the bending axis BAX. The cut unit CU may be filled with the stress relaxation layer 140 including an organic insulating material. The stress relaxation layer 140 extends into the display area DA. For example, as may be seen in FIG. 4, the stress relaxation layer 140 is on the inorganic insulating layer 130 in the display area DA, i.e., between the inorganic insulating layer 130 and the planarization layer 160. In particular, in the display area DA, the planarization layer 160 may be on, e.g., in direct contact with, the stress relaxation layer 140.

The wiring part 150 may be on the stress relaxation layer 140 in the non-display area NDA. The wiring part 150 may include a metal material. The inorganic insulating layer 130 has much less flexibility than the wiring part 150, e.g., may be sufficiently brittle that it may be broken by an external force. Therefore, if the inorganic insulating layer 130 is in the bending area BA, cracks may occur therein by a tensile force due to bending. These cracks may be propagated to other regions of the inorganic insulating layer 130. The cracks in the inorganic insulating layer 130 may cause the wiring part 150 to be disconnected, thereby causing abnormal display of the flexible display apparatus 100.

In the present embodiment, the stress relaxation layer 140 is formed of a material having lower brittleness and higher flexibility than the inorganic insulating layer 130. For example, the stress relaxation layer 140 may be formed of an organic insulating material, e.g., acryl, epoxy, acrylate, polyimide, benzocyclobutene (BCB), or hexamethyldisiloxane (HMDSO). The stress relaxation layer 140 may be formed by filling the cut unit CU and closely attaching to side walls of the cut unit CU such that there is no gap between the stress relaxation layer 140 and the inorganic insulating layer 130.

In addition, in the present embodiment, the stress relaxation layer 140 may have a lower surface that comes in direct contact with not only the side walls of the cut unit CU but also an upper surface of the flexible substrate 110, which is a lower surface of the cut unit CU. Thus, an adhesive force with the flexible substrate 110 is also improved.

Therefore, the flexible display apparatus 100 according to the present embodiment may suppress the occurrence of cracks in the inorganic insulating layer 130 due to bending stress and prevent disconnection of the wiring part 150, by forming the cut unit CU in the inorganic insulating layer 130 in the bending area BA and forming the stress relaxation layer 140 having low brittleness in the cut unit CU.

In more detail, the barrier film 131 may be on the flexible substrate 110. The barrier film 131 blocks infiltration of moisture and oxygen through the flexible substrate 110 and may be formed of a multi-layer film in which silicon oxide ($SiO_2$) and silicon nitride ($SiN_x$) are alternately and repetitively stacked.

The buffer film 132 may be on the barrier film 131. The buffer film 132 provides a planar surface for forming a pixel circuit thereon and may include $SiO_2$ or $SiN_x$.

A semiconductor layer 121 and a first capacitor electrode 125 are on the buffer film 132. The semiconductor layer 121 may be a polysilicon or oxide semiconductor, and the semiconductor layer 121 may be an oxide semiconductor, which may be covered by a separate protective film. The semiconductor layer 121 may include a channel region that is undoped, and a source region and a drain region located at both sides of the channel region and doped with impurities. The first capacitor electrode 125 may include the same material as the semiconductor layer 121.

The gate insulating film 133 is on the semiconductor layer 121 and the first capacitor electrode 125. The gate insulating film 133 may be formed of a single film of $SiO_2$ or $SiN_x$ or a stacked film thereof.

A gate electrode 122 and a second capacitor electrode 126 are formed on the gate insulating film 133. The gate electrode 122 overlaps the channel region of the semiconductor layer 121. The second capacitor electrode 126 may include the same material as the gate electrode 122.

The first interlayer insulating film 134 is formed on the gate electrode 122 and the second capacitor electrode 126, and a third capacitor electrode 127 may be formed on the first interlayer insulating film 134. The third capacitor electrode 127 may include the same material as the gate electrode 122.

The gate insulating film 133 forms a first dielectric film between the first capacitor electrode 125 and the second capacitor electrode 126, and the first interlayer insulating film 134 forms a second dielectric film between the second capacitor electrode 126 and the third capacitor electrode 127, thereby forming a storage capacitor 202.

The second interlayer insulating film 135 may be on the third capacitor electrode 127, and a source electrode 123 and a drain electrode 124 may be on the second interlayer insulating film 135. The first and second interlayer insulating films 134 and 135 may be formed of a single film of $SiO_2$ or $SiN_x$ or a stacked film thereof.

The source electrode 123 and the drain electrode 124 in the display area DA are respectively connected to the source region and the drain region of the semiconductor layer 121 through contact holes formed in the gate insulating film 133, the first and second interlayer insulating films 134 and 135, and the stress relaxation layer 140. Thus, the source electrode 123 and the drain electrode 124 may be on, e.g., directly on, the stress relaxation layer 140. Therefore, the source electrode 123 and the drain electrode 124 are higher than an upper surface of the stress relaxation layer 140.

The wiring part 150 in the bending area BA may be formed of the same material as that of the source electrode 123 and the drain electrode 124. The source electrode 123, the drain electrode 124, and the wiring part 150 may be formed of a metal multi-layer film, e.g., molybdenum (Mo)/aluminum (Al)/Mo or titanium (Ti)/Al/Ti.

The pixel electrode 141 is formed on the planarization layer 160 for each pixel and is connected to the drain electrode 124 of a driving thin-film transistor 201 through the via hole VH formed in the planarization layer 160. The driving thin-film transistor includes the semiconductor layer 121, the gate electrode 122, the source electrode, and the drain electrode 124.

In addition to the driving thin-film transistor 201 and the storage capacitor 202, the pixel circuit may also include a switching thin-film transistor.

The planarization layer 160 is disposed on the driving thin-film transistor 201 and the wiring part 150. The driving thin-film transistor 201 is connected to an organic light-emitting device 203 and drives the organic light-emitting device 203. The planarization layer 160 may include an organic insulating material or an inorganic insulating material or may be in a composite form of the organic insulating material and the inorganic insulating material.

The organic light-emitting device 203 may include a pixel electrode 141, an emission layer 142, and a common electrode 143.

The pixel electrode 141 is formed on the planarization layer 160 for each pixel and is connected to the drain electrode 124 of the driving thin-film transistor 201 through a via hole VH formed in the planarization layer 160.

A pixel defining film 204 is formed on an upper part of the planarization layer 160 and an edge of the pixel electrode 141. The pixel defining film 204 defines a pixel with an opening through which a central part of the pixel electrode 141 is exposed. In addition, the pixel defining film 204 prevents the occurrence of an arc and the like at the edge of the pixel electrode 141 by increasing a distance between the edge of the pixel electrode 141 and the common electrode 143 on an upper part of the pixel electrode 141. The pixel defining film 204 may be formed of an organic material such as polyimide or HMDSO.

The emission layer 142 may be on the pixel electrode 141, and the common electrode 143 may be all over the display area DA regardless of pixel.

FIG. 4 shows only the emission layer 142 on an upper part of the pixel electrode 141, but an intermediate layer besides the emission layer 142 may be further included between the pixel electrode 141 and the common electrode 143. The intermediate layer of the organic light-emitting device 203 may include a low or high molecular material. When the intermediate layer includes a low molecular material, the intermediate layer may have a structure in which a hole injection layer (HIL), a hole transport layer (HTL), an emission layer (EML), an electron transport layer (ETL), an electron injection layer (EIL), and the like are stacked in a single or composite structure, and may include various organic materials, e.g., including copper phthalocyanine (CuPc), N,N'-Di(naphthalene-1-yl)-N,N'-diphenyl-benzidine (NPB), tris-8-hydroxyquinoline aluminum (Alq3), and the like. These layers may be formed by a vacuum deposition method.

When the intermediate layer includes a high molecular material, the intermediate layer may mainly have a structure including an HTL and an EML. In this case, the HTL may include polyethylenedioxythiophene (PEDOT), and the EML may include a high molecular material of a polyphenylenevinylene (PPV) group, a polyfluorene group, or the like. The intermediate layer may be formed by screen printing, inkjet printing, laser induced thermal imaging (LITI), or the like.

Any one of the pixel electrode 141 and the common electrode 143 injects holes into the emission layer 142, and the other one thereof injects electrons into the emission layer 142. The electrons and the holes are bonded in the emission layer 142 such that excitons are generated, and light is emitted by energy generated when the excitons transit from an excited state to a ground state.

The pixel electrode 141 may be formed of a reflective film, and the common electrode 143 may be formed of a transparent film or a translucent film. The light emitted from the emission layer 142 is reflected from the pixel electrode 141, transmits through the common electrode 143, and then is output to the outside. When the common electrode 143 is formed of a translucent film, a portion of the light reflected from the pixel electrode 141 is re-reflected from the common electrode 143, and the pixel electrode 141 and the common electrode 143 may form a resonance structure, thereby increasing light extraction efficiency.

The organic light-emitting device 203 is covered by the encapsulation part 210. The encapsulation part 210 may seal the organic light-emitting device 203 such that deterioration of the organic light-emitting device 203 due to moisture and oxygen included in external air is suppressed. The encapsulation part 210 may have a stacked structure of an inorganic material and an organic material and may include, e.g., a first inorganic film 211, an organic film 212, and a second inorganic film 213.

Referring again to the stress relaxation layer 140, as shown in FIG. 4, in the present embodiment, the stress relaxation layer 140 fills the cut unit CU and extends into the display area DA. Thus, a thickness T of the stress relaxation layer 140 filling the cut unit CU of the inorganic insulating layer 130 may be greater than a depth D of the cut unit CU. Therefore, the wiring part 150 may be in direct contact with the stress relaxation layer 140, not with the inorganic insulating layer 130.

Figure 5:
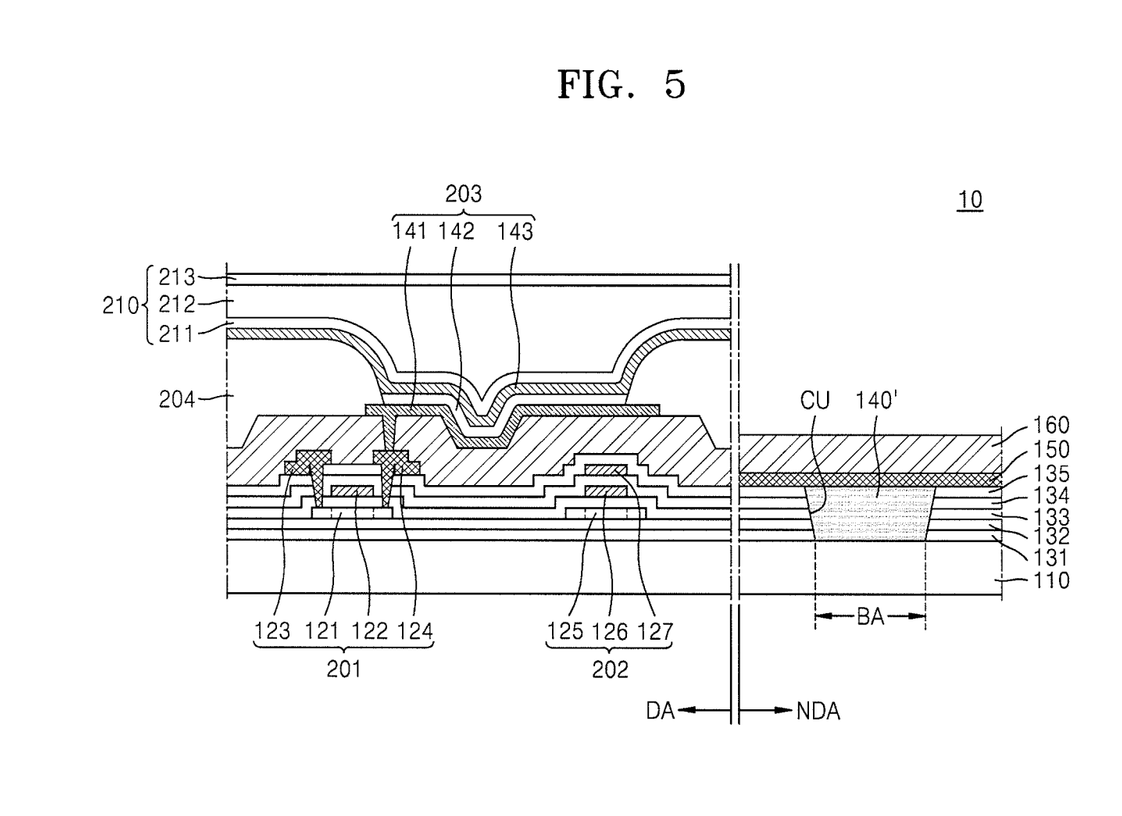
FIG. 5 illustrates a schematic cross-sectional view showing a display area DA and a bending area BA of a flexible display apparatus according to a comparative example.

FIG. 5 is a schematic cross-sectional view showing a display area DA and a bending area BA of a flexible display apparatus 10 according to a comparative example. Referring to FIG. 5, unlike the present embodiment, in the flexible display apparatus 10 according to the comparative example, a stress relaxation layer 140' including an organic insulating material fills a cut unit CU, but the stress relaxation layer 140' does not extend to the display area DA. As shown in FIG. 5, the planarization layer 160 and the inorganic insulating layer 130 are in direct contact with each other in the bend area BA outside the cut unit CU. Therefore, the thickness T of the stress relaxation layer 140' in the cut unit CU of the inorganic insulating layer 130 cannot be greater than the depth D of the cut unit CU.

In the flexible display apparatus 10 according to the comparative example of FIG. 5, the stress relaxation layer 140' filling the cut unit CU in the bending area BA does not extend to the display area DA and a planarization layer 160' may be different than the planarization layer 160 of FIG. 4. Since the stress relaxation layer 140' is not in the display area DA in FIG. 5, the source electrode 123 and the drain electrode 124 are respectively connected to the source region and the drain region of the semiconductor layer 121 through contact holes in the first and second interlayer insulating films 134 and 135 and the gate insulating film 133. Otherwise, elements of FIG. 5 are the same as those of FIG. 4, and description thereof will not be repeated.

As described above, unlike the comparative example, in the flexible display apparatus 100 according to the present embodiment, a difference between the thickness T of the stress relaxation layer 140 filling the cut unit CU and the depth D of the cut unit CU may prevent color separation of reflective light reflected from a light-emitting device of the display 120, as described in detail below.

External light incident to the organic light-emitting device 203 from the outside of the flexible display apparatus 10 is emitted by being reflected from various kinds of electrodes and wirings located inside the flexible display apparatus 10. The reflected external light may be mixed with light emitted from the emission layer 142, thereby causing noise. Particularly, according to flatness of the pixel electrode 141 acting as a reflective electrode, a color separation phenomenon of the reflected external light may be affected.

The flatness of the pixel electrode 141 depends on flatness of the planarization layer 160 in direct contact with the pixel electrode 141. The flatness of the planarization layer 160 may depend on a design of a thin-film transistor, a capacitor, and wirings arranged at a lower part of the planarization layer 160.

In the flexible display apparatus 10 according to the comparative example, the planarization layer 160 is formed to make the display 120 flat. However, due to a level difference by a structure of the thin-film transistor, the capacitor, and the wirings arranged at a lower part of the planarization layer 160, a tilt angle θ (see FIG. 6) of the pixel electrode 141 with a plane parallel to the flexible substrate 110 exceeds 1.0°.

However, referring to FIG. 4, the flexible display apparatus 100 according to the present embodiment has the stress relaxation layer 140 including an organic insulating material at a lower part of the planarization layer 160 and also extends to the display area DA. Thus, a level difference by a structure of a thin-film transistor, a capacitor, and wirings arranged at a lower part of the stress relaxation layer 140 is alleviated. Since the planarization layer 160 is formed in a state in which the level difference is alleviated, the tilt angle θ of the pixel electrode 141 with a plane parallel to the flexible substrate 110 does not exceed 1.0°. That is, an upper surface of the planarization layer 160 is substantially flat.

Therefore, according to the present embodiment, a distance from the upper surface of the planarization layer 160 to the flexible substrate 110 in a region overlapping the driving thin-film transistor 201 may be substantially the same as a distance from the upper surface of the planarization layer 160 to the flexible substrate 110 in a region overlapping the cut unit CU.

Figure 7A:
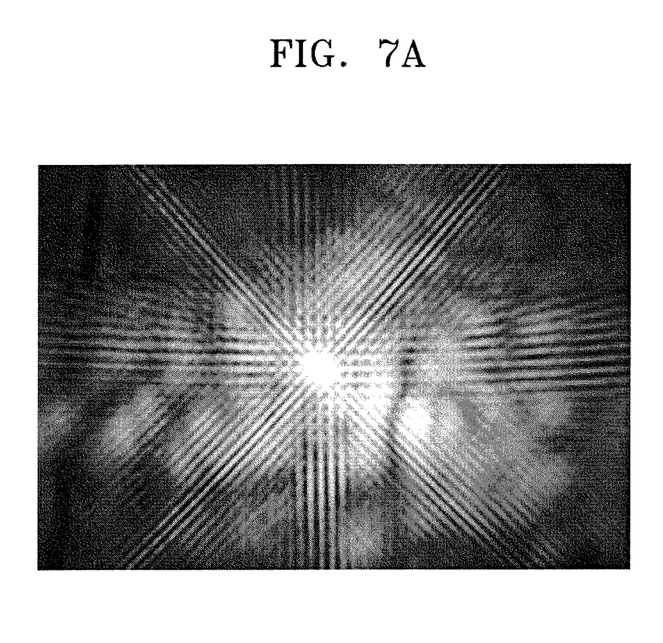
FIG. 7A illustrates an image showing a phenomenon that a reflective color of external light is separated when a tilt angle of the pixel electrode exceeds 1.0°.

FIG. 7A illustrates an image showing a phenomenon that a reflective color of external light is separated when a tilt angle of the pixel electrode 141 exceeds 1.0°. That is, reflected external lights are not mixed to emit white light but separated to respective unique colors, thereby generating noise.

Figure 7B:
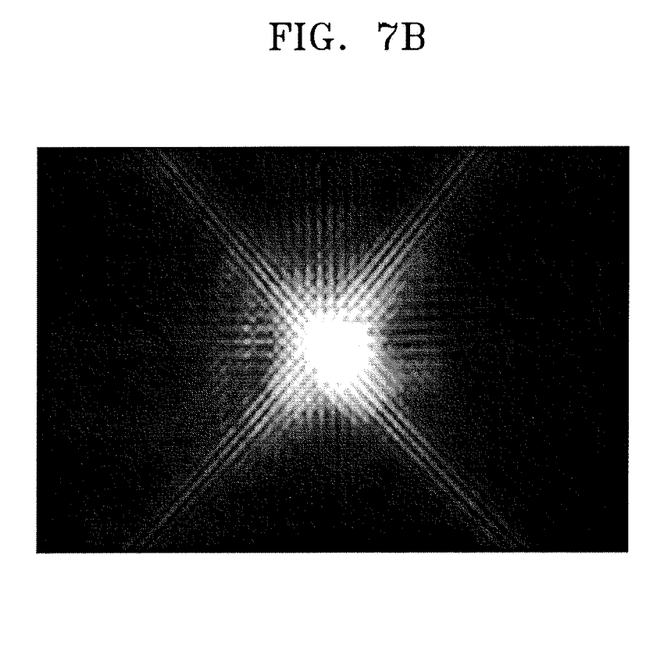
FIG. 7B illustrates an image showing a phenomenon that a reflective color of external light is separated when a tilt angle of the pixel electrode is smaller than 1.0°.

FIG. 7B illustrates an image showing a phenomenon that a reflective color of external light is separated when a tilt angle of the pixel electrode 141 is smaller than 1.0°. Although color separation of reflected external lights does not fully disappear, the color separation is significantly alleviated when compared with FIG. 7A.

Figure 6:
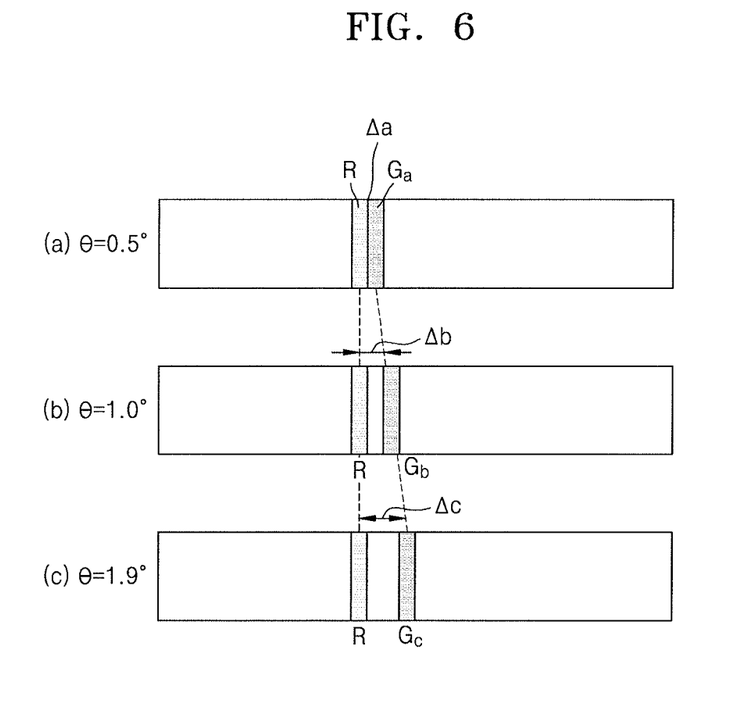
FIG. 6 illustrates color separation degrees of external light according to tilt angles when a pixel electrode of a green light-emitting pixel is tilted from a surface parallel to a flexible substrate.

FIG. 6 illustrates color separation degrees of external light according to tilt angles when the pixel electrode 141 of a green light-emitting pixel is tilted from a surface parallel to a flexible substrate.

(a) of FIG. 6 shows relative locations of a red band R and a green band Ga of reflected external light when the tilt angle θ is 0.5°, (b) of FIG. 6 shows relative locations of the red band R and the green band Ga of reflected external light when the tilt angle θ is t1.0°, and (c) of FIG. 6 shows relative locations of the red band R and the green band Ga of reflected external light when the tilt angle θ is 1.9°.

A difference of the green band Ga based on the red band R in (a) of FIG. 6 is Δa, a difference of the green band Ga based on the red band R in (b) of FIG. 6 is Δb, and a difference of the green band Ga based on the red band R in (c) of FIG. 6 is Δc. A color separation phenomenon increases from (a) of FIG. 6 to (c) of FIG. 6, i.e., as the tilt angle θ increases.

In the present embodiment, since the stress relaxation layer 140 extends into the display area DA, roughness due to a thin-film transistor, a capacitor, and wirings arranged at a lower part of the pixel electrode 141 may be reduced. Since the planarization layer 160 is on the stress relaxation layer 140, a tilt angle of the pixel electrode 141 may be reduced.

Therefore, the flexible display apparatus 100 according to the present embodiment may have the bending area BA to reduce a dead space. In addition, by forming the cut unit CU in the bending area BA and filling the stress relaxation layer 140 therein, cracks in an inorganic insulating layer and disconnection of a wiring may be prevented. In addition, by reducing a tilt angle of the pixel electrode 141 by having the stress relaxation layer 140 extending into the display area DA, color separation of external light may be prevented, thereby increasing display quality.

Hereinafter, various embodiments of the present disclosure will be described with reference to FIGS. 8 to 10.

Figure 8:
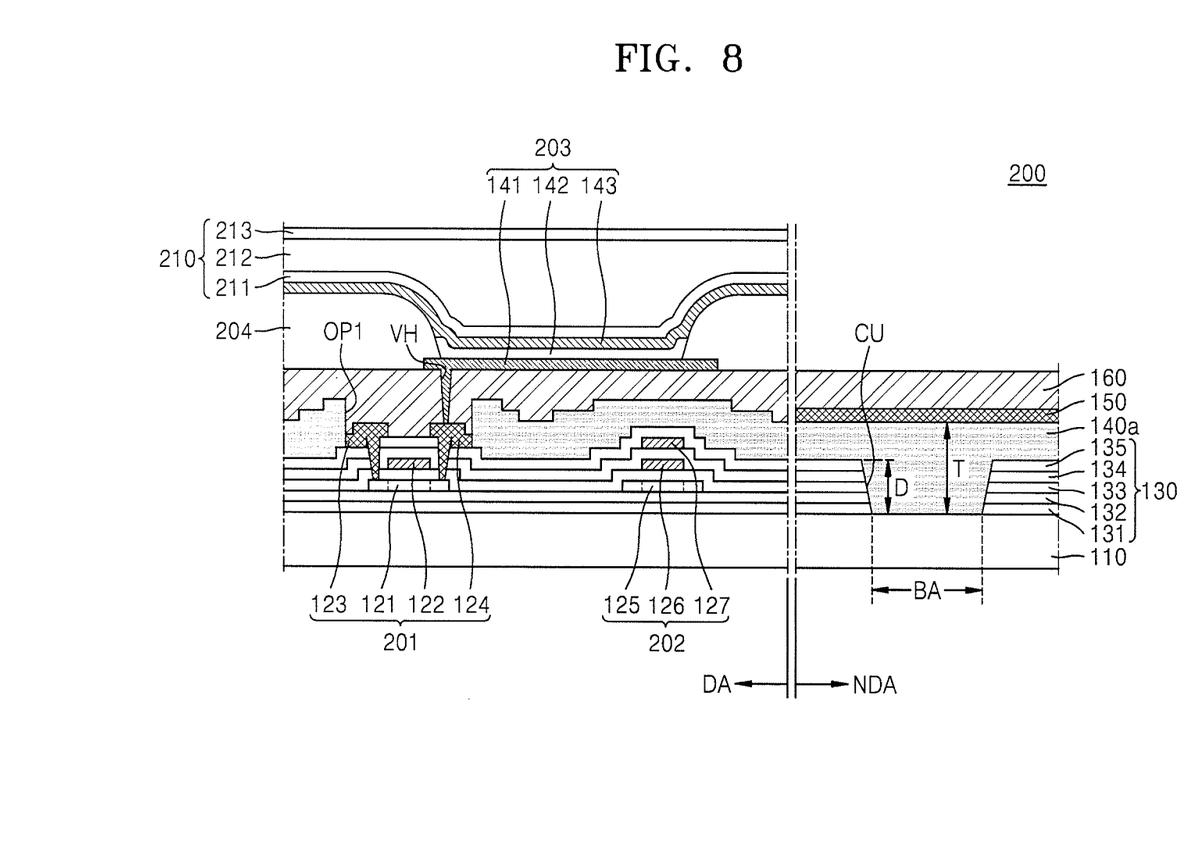
FIG. 8 illustrates a schematic cross-sectional view showing a display area DA and a bending area BA of a flexible display apparatus according to a second embodiment.

FIG. 8 is a schematic cross-sectional view showing a display area DA and a bending area BA of a flexible display apparatus 200 according to a second embodiment. A description will be made based on differences when compared with FIG. 4 showing the flexible display apparatus 100 according to the first embodiment. Like reference numerals in FIG. 4 refer to like elements in FIG. 4.

The flexible display apparatus 200 according to the second embodiment differs from the flexible display apparatus 100 according to the first embodiment with respect to a pattern of the stress relaxation layer 140 in the display area DA. According to the present embodiment, a stress relaxation layer 140a filling the cut unit CU of the bending area BA and simultaneously extends into the display area DA, but an opening OP1 is in the stress relaxation layer 140a to expose a location where the source electrode 123 and the drain electrode 124.

The source electrode 123 and the drain electrode 124 are formed in the opening OP1 such that upper surfaces of the source electrode 123 and the drain electrode 124 are not higher than an upper surface of the stress relaxation layer 140a, e.g., may be lower than the upper surface of the stress relaxation layer 140a. Thus, the source electrode 123 and the drain electrode 124 are not on the stress relaxation layer 140a. When the source electrode 123 and the drain electrode 124 are formed, the wiring part 150 may also formed simultaneously on the stress relaxation layer 140a.

The planarization layer 160 is formed on the source electrode 123, the drain electrode 124, and the wiring part 150, and the drain electrode 124 is connected to the pixel electrode 141 through a via hole VH formed in the planarization layer 160.

Since the source electrode 123 and the drain electrode 124 are formed in the opening OP1, roughness due to the source electrode 123 and the drain electrode 124 arranged at a lower part of the pixel electrode 141 is small. Thus, a tilt angle of the pixel electrode 141 may be further reduced when compared with the first embodiment.

Figure 9:
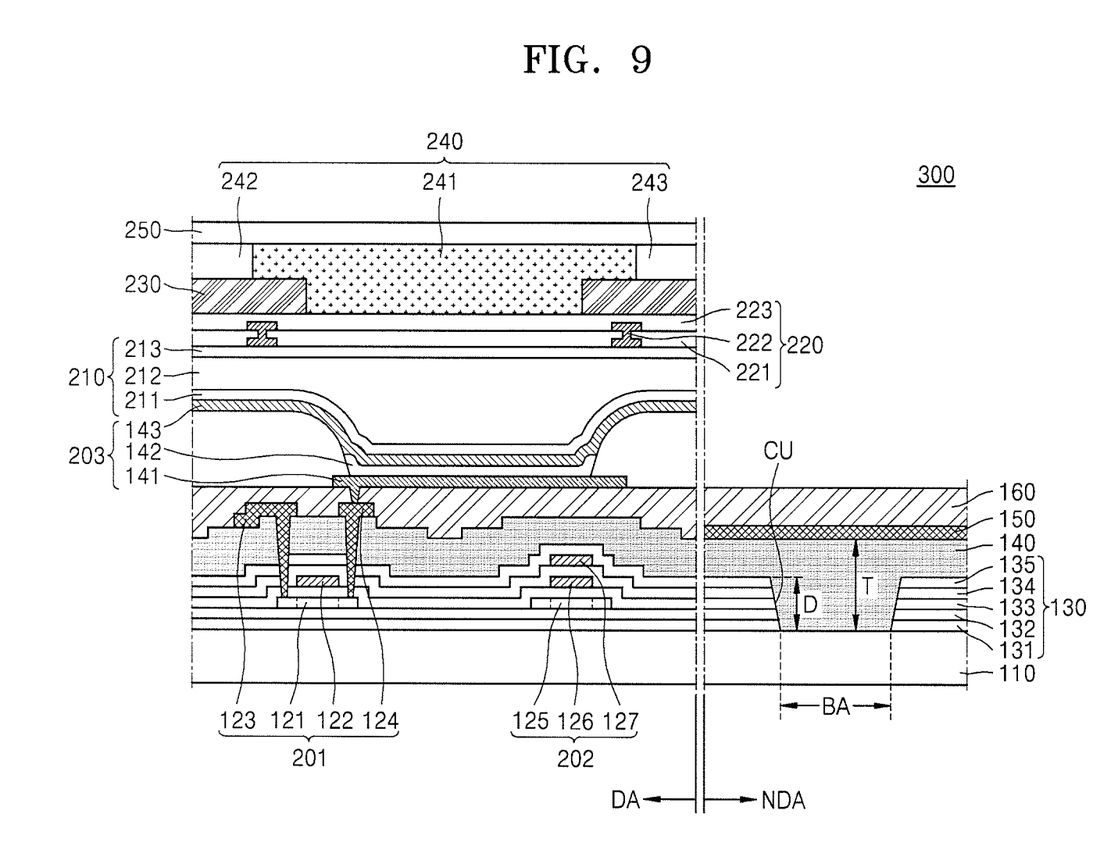
FIG. 9 illustrates a schematic cross-sectional view showing a display area DA and a bending area BA of a flexible display apparatus according to a third embodiment.

FIG. 9 is a schematic cross-sectional view showing a display area DA and a bending area BA of a flexible display apparatus 300 according to a third embodiment. A description will be made based on differences when compared with FIG. 4 showing the flexible display apparatus 100 according to the first embodiment. Like reference numerals in FIG. 4 refer to like elements in FIG. 4.

The flexible display apparatus 300 according to the third embodiment differs from the flexible display apparatus 100 according to the first embodiment in that the flexible display apparatus 300 further includes a touch layer 220, color filters 240, a black matrix 230, and a protective layer 250 on the encapsulation part 210.

The touch layer 220 includes a first insulating layer 221 formed on the encapsulation part 210, a second insulating layer 222 formed on the first insulating layer 221, and a plurality of touch electrodes 223 formed between the first insulating layer 221 and the second insulating layer 222. Alternatively, the touch layer 220 may include various electrode structures, e.g., a mesh electrode pattern and a transparent segment electrode.

The touch layer 220 may detect a touch input based on a mutual capacitance change caused by the touch input. That is, when a touch input is applied, a mutual capacitance is changed by the touch input, and a touch detector connected to the touch layer 220 may detect a location at which the mutual capacitance is changed, thereby detecting the touch input The color filters 240 and the black matrix 230 are arranged on the touch layer 220. The black matrix 230 overlaps a non-emission region of a pixel, and the color filters 240 overlap emission regions, respectively. The color filters 240 may include red color filters 242, green color filters 241, and blue color filters 243.

The black matrix 230 includes a material capable of blocking light. For example, the black matrix 230 may include an organic material having high light absorption ratio. The black matrix 230 may include a black pigment or a black dye. The black matrix 230 includes a light-sensitive organic material, e.g., may include a coloring agent such as a pigment or a dye. The black matrix 230 may have a single- or multi-layer structure.

Although FIG. 9 shows that the color filters 240 cover a portion of the black matrix 230, according to a forming sequence of the black matrix 230 and the color filters 240, the black matrix 230 may cover a portion of the color filters 240, or the color filters 240 may cover a portion of the black matrix 230.

The color filters 240 may not only transmit light generated by the organic light-emitting device 203 to the outside but also reduce a reflectance of light incident from the outside. When external light passes through the color filters 240, light intensity of the external light is reduced to about one third thereof.

A portion of the light which has passed through the color filters 240 is extinguished, and the remaining portion of the light is reflected from components arranged under the color filters 240, for example, a thin-film transistor, a capacitor, wirings, the encapsulation part 210, and the like arranged at a lower part of the pixel electrode 141.

The reflected light is incident to the color filters 240, and brightness of the reflected light is reduced while passing through the color filters 240. As a result, since only a portion of the external light is reflected and discharged from the flexible display apparatus 300, external light reflection may be reduced.

In addition, according to the present embodiment, since not only external light reflection is reduced by using the color filters 240 and the black matrix 230 but also a polarizing film generally used to reduce external light reflection does not have to be used, a thickness of the flexible display apparatus 300 may be reduced. In addition, a thin display apparatus may be manufactured, and the present embodiment may be used for a foldable or bendable display apparatus.

As described above, compared with the flexible display apparatus 100 according to the first embodiment in FIG. 4, the flexible display apparatus 300 including the color filters 240 and the black matrix 230 may reduce external light reflection, but a tilt angle of the pixel electrode 141 functioning as a reflective electrode still affects external light reflection of the flexible display apparatus 300. According to the present embodiment, since the stress relaxation layer 140 extends into the display area DA, roughness due to a thin-film transistor, a capacitor, and wirings arranged at a lower part of the pixel electrode 141 may be small, and since the planarization layer 160 is once more formed on the stress relaxation layer 140, a tilt angle of the pixel electrode 141 may be reduced, thereby much efficiently reducing external light reflection.

Figure 10:
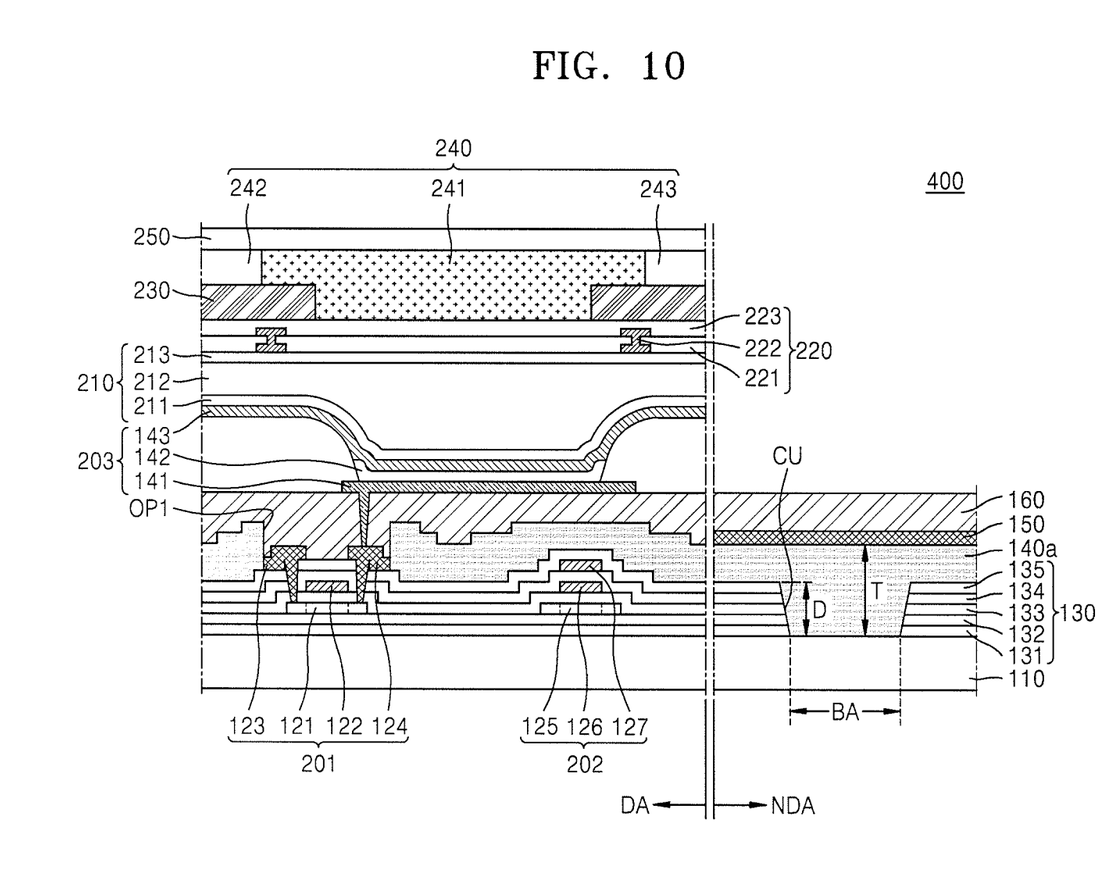
FIG. 10 illustrates a schematic cross-sectional view showing a display area DA and a bending area BA of a flexible display apparatus according to a fourth embodiment.

FIG. 10 is a schematic cross-sectional view showing a display area DA and a bending area BA of a flexible display apparatus 400 according to a fourth embodiment. A description will be made based on differences when compared with FIG. 9 showing the flexible display apparatus 300 according to the third embodiment. Like reference numerals refer to like elements.

The flexible display apparatus 400 according to the fourth embodiment differs from the flexible display apparatus 300 according to the third embodiment with respect to a pattern of the stress relaxation layer 140 formed in the display area DA. According to the present embodiment, the stress relaxation layer 140a fills the cut unit CU of the bending area BA and simultaneously extends to the display area DA, but the opening OP1 is in the stress relaxation layer 140a to expose a location where the source electrode 123 and the drain electrode 124 are formed.

The source electrode 123 and the drain electrode 124 are formed in the opening OP1 such that upper surfaces of the source electrode 123 and the drain electrode 124 are not higher than an upper surface of the stress relaxation layer 140a. When the source electrode 123 and the drain electrode 124 are formed, the wiring part 150 is also formed together on the stress relaxation layer 140a.

The planarization layer 160 is formed on the source electrode 123, the drain electrode 124, and the wiring part 150, and the drain electrode 124 is connected to the pixel electrode 141 through a via hole VH formed in the planarization layer 160. Since the source electrode 123 and the drain electrode 124 are formed in the opening OP1, roughness due to the source electrode 123 and the drain electrode 124 arranged at a lower part of the pixel electrode 141 is small, and thus a tilt angle of the pixel electrode 141 may be further reduced when compared with the third embodiment.

A flexible display apparatus, according to an embodiment, may have a bending area formed outside a display area, thereby reducing a dead space. A cut unit filled with a stress relaxation layer may be in the bending area. Thus, cracks in an inorganic insulating layer and disconnection of a wiring may be prevented.

In addition, the flexible display apparatus, according to an embodiment, may have the stress relaxation layer extending into the display area to reduce a tilt angle of a pixel electrode, such that color separation of external light is prevented, thereby increasing display quality.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A flexible display apparatus, comprising:
   a flexible substrate including a display area a bending area outside the display area, the bending area to be bent around a bending axis;
   an inorganic insulating layer on the flexible substrate;
   a cut unit in the inorganic insulating layer in the bending area;
   a stress relaxation layer filling the cut unit and extending into the display area;
   a wiring part on the stress relaxation layer in the bending area;
   a planarization layer covering the wiring part and on the stress relaxation layer;
   a display on the planarization layer in the display area and electrically connected to the wiring part; and
   a thin film transistor located in the display area, the thin film transistor including a source electrode and a drain electrode, wherein
   the stress relaxation layer includes an upper surface that directly contacts a lower surface of the source electrode, a lower surface of the drain electrode, and a lower surface of the wiring part.

2. The flexible display apparatus as claimed in claim 1, wherein, in the display area, the planarization layer is on the stress relaxation layer.

3. The flexible display apparatus as claimed in claim 1, wherein the cut unit extends in a direction parallel to the bending axis.

4. The flexible display apparatus as claimed in claim 1, wherein the stress relaxation layer includes an organic insulating material.

5. The flexible display apparatus as claimed in claim 1, wherein a thickness of the stress relaxation layer in the cut unit is greater than a depth of the cut unit.

6. The flexible display apparatus as claimed in claim 1, wherein a lower surface of the stress relaxation layer in the cut unit is in direct contact with an upper surface of the flexible substrate.

7. The flexible display apparatus as claimed in claim 1, wherein the planarization layer includes an organic insulating material.

8. The flexible display apparatus as claimed in claim 1, wherein:
   in the display area, the thin-film transistor electrically connects the display to the wiring part, and
   a distance from an upper surface of the planarization layer to the flexible substrate in a region overlapping the thin-film transistor is substantially the same as a distance from the upper surface of the planarization layer to the flexible substrate in a region overlapping the cut unit.

9. The flexible display apparatus as claimed in claim 1, wherein:
   in the display area, the thin-film transistor electrically connects the display to the wiring part, and
   an upper surface of an uppermost electrode of the thin-film transistor is higher than an upper surface of the stress relaxation layer.

10. The flexible display apparatus as claimed in claim 9, wherein the wiring part includes a same material as the uppermost electrode of the thin-film transistor.

11. The flexible display apparatus as claimed in claim 1, wherein the flexible substrate includes:
    a first substrate including a polymer resin;
    a second substrate on the first substrate and including a polymer resin; and
    a barrier film between the first substrate and the second substrate.

12. The flexible display apparatus as claimed in claim 11, wherein, in the cut unit, a lower surface of the stress relaxation layer is in direct contact with an upper surface of the second substrate.

13. A touch-detecting display apparatus, comprising:
    a flexible substrate including a display area and a bending area outside the display area, the bending area to be bent around a bending axis;
    an inorganic insulating layer on the flexible substrate;
    a stress relaxation layer filling a cut unit in the inorganic insulating layer in the bending area, and extending into the display area;
    a wiring part on the stress relaxation layer in the bending area;
    a planarization layer covering the wiring part and on the stress relaxation layer;
    a display on the planarization layer in the display area and electrically connected to the wiring part;
    a thin film transistor located in the display area, the thin film transistor including a source electrode and a drain electrode;
    a flexible encapsulation part covering the display;
    a touch detection layer on the flexible encapsulation part;
    color filters on the touch detection layer; and
    a black matrix between the color filters, wherein
    the stress relaxation layer includes an upper surface that directly contacts a lower surface of the source electrode, a lower surface of the drain electrode, and a lower surface of the wiring part.

14. The touch-detecting display apparatus as claimed in claim 13, wherein:
    the display includes a first electrode, an organic light-emitting layer, and a second electrode, and
    a tilt angle of the first electrode with a plane parallel to the flexible substrate is smaller than 0.1°.

15. The touch-detecting display apparatus as claimed in claim 13, wherein, in the display area, the planarization layer is on the stress relaxation layer.

16. The touch-detecting display apparatus as claimed in claim 13, wherein the color filters and the black matrix share an overlapping area.

17. The touch-detecting display apparatus as claimed in claim 13, wherein:
    a pad electrode electrically connected to the wiring part is at an edge of the flexible substrate, and when the bending area is bent, the pad electrode overlaps the display area.

18. The touch-detecting display apparatus as claimed in claim 13, wherein a thickness of the stress relaxation layer is greater than a depth of the cut unit.

19. The touch-detecting display apparatus as claimed in claim 13, wherein:
- in the display area, the thin-film transistor electrically connects the display to the wiring part, and
- a distance from an upper surface of the planarization layer to the flexible substrate in a region overlapping the thin-film transistor is substantially the same as a distance from the upper surface of the planarization layer to the flexible substrate in a region overlapping the cut unit.

* * * * *